(12) United States Patent
Zhang et al.

(10) Patent No.: US 11,316,614 B2
(45) Date of Patent: Apr. 26, 2022

(54) CHANNEL CODE CONSTRUCTION FOR DECODER REUSE

(71) Applicant: HUAWEI TECHNOLOGIES CO., LTD., Guangdong (CN)

(72) Inventors: Huijian Zhang, Boulogne Billancourt (FR); Zhipeng Zhao, Shenzhen (CN); Wai Kong Raymond Leung, Shenzhen (CN); Marc Fossorier, Munich (DE); Ingmar Land, Boulogne Billancourt (FR)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/934,180

(22) Filed: Jul. 21, 2020

(65) Prior Publication Data

US 2020/0351017 A1    Nov. 5, 2020

Related U.S. Application Data

(63) Continuation of application No. PCT/EP2018/051596, filed on Jan. 23, 2018.

(51) Int. Cl.
*H04L 1/00* (2006.01)
*H03M 13/11* (2006.01)
(Continued)

(52) U.S. Cl.
CPC ....... *H04L 1/0061* (2013.01); *H03M 13/1102* (2013.01); *H03M 13/152* (2013.01);
(Continued)

(58) Field of Classification Search
None
See application file for complete search history.

(56) References Cited

U.S. PATENT DOCUMENTS 6,131,178 A    10/2000   Fujita et al.
6,289,000 B1 *  9/2001   Yonge, III ........ H03M 13/2909
                                                                370/203
(Continued)

FOREIGN PATENT DOCUMENTS

CN     101243664 A    8/2008
CN     101454982 A    6/2009
(Continued)

OTHER PUBLICATIONS

P. Palanisamy and T. V. S. Sreedhar, "Performance analysis of Raptor codes in Wi-Max systems over fading channel," TENCON 2008-2008 IEEE Region 10 Conference, 2008, pp. 1-5, doi: 10.1109/TENCON.2008.4766717. (Year: 2008).*

(Continued)

*Primary Examiner* — Daniel F. McMahon (57) ABSTRACT

The present disclosure provides a code generator for generating an {N', K'} code for encoding and/or decoding data transmitted in a communication channel from an {N, K} code, wherein N and N' are code lengths, K and K' are code dimensions. The code generator is configured to shorten the {N, K} code to obtain an intermediate code, and to extend the intermediate code to obtain the {N', K'} code. The present disclosure also provides a corresponding code construction method. Further, the present disclosure provides a device for encoding and/or decoding data transmitted in a communication channel, the device being configured to encode and/or decode the data based on an {N', K'} code generated from the {N, K} code.

20 Claims, 10 Drawing Sheets

(51) Int. Cl.
*H03M 13/15* (2006.01)
*H03M 13/19* (2006.01)
*H03M 13/00* (2006.01)

(52) U.S. Cl.
CPC ......... *H03M 13/19* (2013.01); *H03M 13/616* (2013.01); *H04L 1/0041* (2013.01)

(56) References Cited

U.S. PATENT DOCUMENTS

| | | | |
|---|---|---|---|
| 2007/0011568 A1 | 1/2007 | Hocevar | |
| 2009/0106625 A1* | 4/2009 | Jun | H04L 1/0057 714/758 |
| 2013/0139028 A1 | 5/2013 | Goel | |
| 2013/0283131 A1* | 10/2013 | Tsatsaragkos | H03M 13/033 714/776 |
| 2018/0183464 A1* | 6/2018 | Ge | H04L 1/0069 |
| 2018/0367163 A1* | 12/2018 | Saber | H03M 13/616 |
| 2019/0349010 A1* | 11/2019 | Wu | H03M 13/1505 |

FOREIGN PATENT DOCUMENTS

| | | |
|---|---|---|
| CN | 102130868 A | 7/2011 |
| CN | 102710266 A | 10/2012 |
| CN | 107294543 A | 10/2017 |
| JP | 2016149703 A | 8/2016 |
| TW | 417360 B | 1/2001 |

OTHER PUBLICATIONS

Zhao, Yue, and Francis CM Lau. "Implementation of decoders for LDPC block codes and LDPC convolutional codes based on GPUs." IEEE Transactions on Parallel and Distributed Systems 25.3 (2013): 663-672. (Year: 2013).*

Benjamin Smith et al, "Leveraging 400G ZR FEC Technology", vol. 802.3.B10K, Nov. 8-9, 2017, pp. 1-10, IEEE Draft; IEEE-SA, Piscataway, NJ USA, XP068124263.

Christian Häger et al, "Approaching Miscorrection-free Performance of Product and Generalized Product Codes", arxiv.org, Cornell University Library, 201 Olin Library Cornell University Ithaca, NY 14853, Nov. 21, 2017, XP080839029, pp. 1-11.

Macwilliams F J and Sloane N J A, "Theory of error-correcting codes passage", Theory of Error-Correcting Codes, X, XX,Jan. 1, 1977 (Jan. 1, 1977), total 4 pages, XP002226718.

Morelos-Zaragoza R H, "The Art of Error Correcting Coding, PASSAGE", Art of Error Correcting Coding, John Wiley and Sons LTD, Jan. 1, 2002 (Jan. 1, 2002), pp. 101-120, XP002366026.

F.J. MacWilliams, N.J.A. Sloane, "The Theory of Error-Correcting Codes", North Holland Publishing Co.,1977. total 771 pages.

D. Chase, A Class of Algorithms for Decoding Block Codes With Channel Measurement Information, IEEE Transactions on Information Theory, vol. IT-18, No. 1, pp. 170-182, Jan. 1972.

M. P. C. Fossorier et al., "Reliability-Based Syndrome Decoding of Linear Block Codes", IEEE Transactions on Information Theory, vol. 44, No. 1, Jan. 1998, pp. 388-398.

International Search Report and Written Opinion issued in PCT/EP2018/051596 dated Jul. 20, 2018, total 19 pages.

Office Action issued in CN201880085045.X, dated Aug. 18, 2021, 6 pages.

Qu Yun-yun et al, Extended Hamming Code Information Reconciliation Protocol, Journal of Southwest University (Natural Science Edition), vol. 33, No. 3, Mar. 2011, with English Abstract, 4 pages.

Notice of Allowance issued in CN201880085045.X, dated Jan. 25, 2022, 5 pages.

* cited by examiner

CHANNEL CODE CONSTRUCTION FOR DECODER REUSE

CROSS-REFERENCE TO RELATED APPLICATIONS

This application is a continuation of International Application No. PCT/EP2018/051596, filed on Jan. 23, 2018, the disclosure of which is hereby incorporated by reference in its entirety.

TECHNICAL FIELD

The present disclosure relates to an encoding and/or decoding device, which uses a modified channel code that is modified from an original channel code. The present disclosure also relates to a code generator for generating a modified code from an original code by modifying the original code. In particular, the modified code, which is defined by a check matrix, is obtained by modifying a check matrix defining the original code. The present disclosure also relates to a channel code generating method.

BACKGROUND

Figure 7:
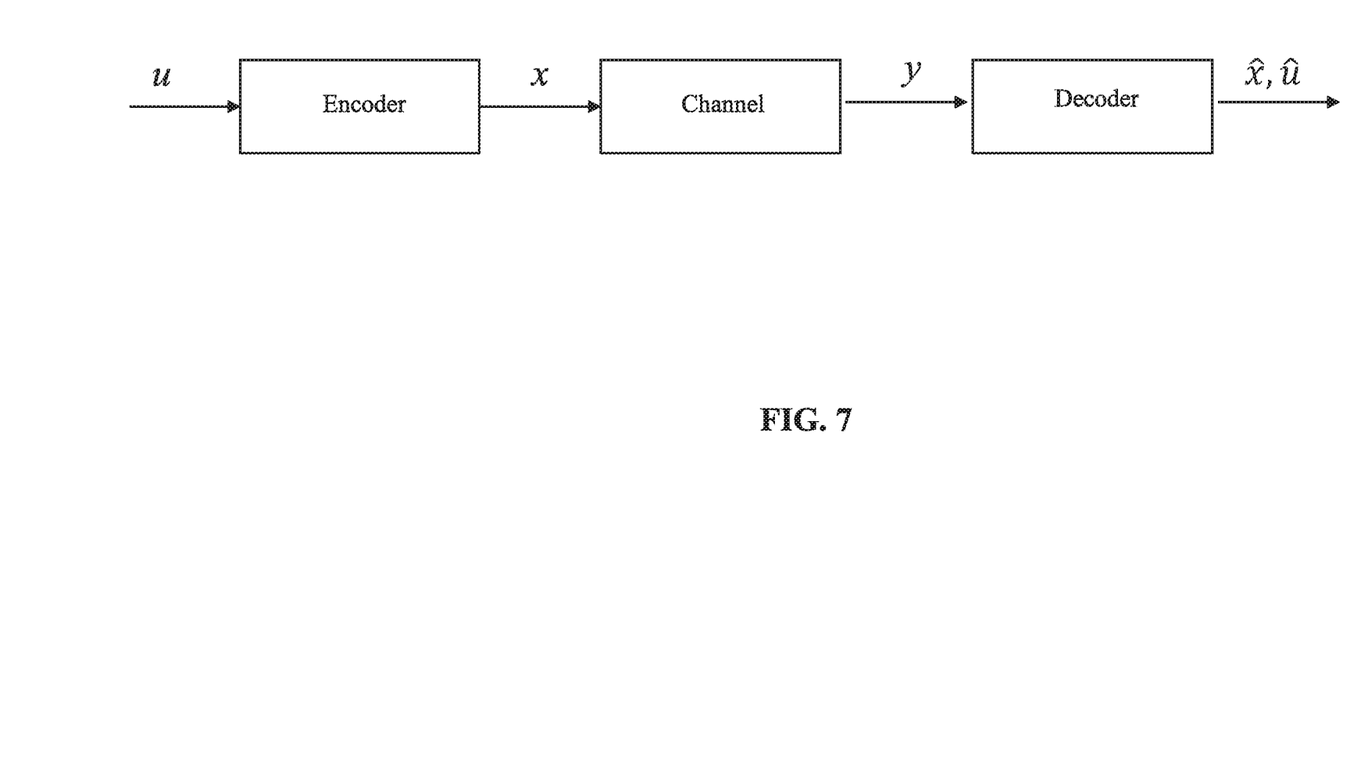
FIG. 7 shows schematically a transmission system for FEC coding.

Channel codes are essential in all digital communications systems. A typical system for forward error correction (FEC) coding, also called a coding scheme, is shown in FIG. 7. The system includes an encoder (at the transmitter side) and a decoder (at the receiver side), which are connected via a communication channel. The encoder adds redundancy to data to be transmitted in the communication channel, i.e. adds redundant data. The decoder exploits this redundancy to correct transmission errors, such that the receiver ideally obtains the transmitted data free of errors despite noise in the communication channel.

In particular, in FIG. 7, the data u to be transmitted (termed "information word") is given to the encoder, which produces a codeword x containing redundancy. This codeword x is then transmitted over the noisy communication channel, which typically introduces errors. The output vector y is provided to the decoder, which produces estimates of the transmitted codeword x and the transmitted data u. A set C of possible codewords is called the code (or channel code), and the following description is particularly concerned with such a code.

For reasons of complexity at the encoder and decoder sides, typically linear codes over finite fields are employed. The following explanation is thus provided for the finite field $F_2=\{0, 1\}$ of size 2—for the sake of simplicity. However, the following explanation holds in a similar manner for other fields or rings. In particular, a code C of length N and dimension K (labelled in the present disclosure as an '$\{N, K\}$ code'), may be defined by a generator matrix G of size K×N as:

$$C=\{x=u \cdot G : u \in F_2^K\}$$

In that case, the encoder that maps the information word u of length K to the codeword x of length N is given by $$x=u \cdot G$$

where addition and multiplication are over the binary field $\{0, 1\}$. Alternatively, the code C may be defined by the parity check matrix H (hereinafter "check matrix") of size (N−K)×N as:

$$C=\{x \in F_2^N : x \cdot H^T = 0\}$$

By this definition a vector x is a codeword if and only if, $$x \cdot H^T = 0$$

For a given generator matrix, check matrices can be determined, and vice versa.

In a communication system, the information word u is encoded into the codeword x, and this codeword x is then transmitted over the noisy communication channel, yielding the observation vector y of length N. Based on the observation vector y, the decoder determines the most-likely codeword (codeword estimate) $\hat{x}$ and the corresponding information word (information word estimate) $\hat{u}$. This is called decoding.

For example, the maximum-likelihood (ML) decoder minimises the probability of a wrong decision, however, often at high decoding complexity. Other decoding methods, like Chase decoding or syndrome decoding, typically approximate this decision under lower decoding complexity.

An important property of a channel code is its minimum distance d, which is the minimum Hamming distance, i.e. the number of different positions between any two codewords. Due to the linearity of the code, this is also equal to the minimum Hamming weight, i.e. the number of non-zero positions of any code word. A second important property of a channel code is the number of such minimum-distance codewords, also called the multiplicity. The minimum distance together with its multiplicity determine the error rate of a code under ML decoding and many other decoding methods at low noise levels.

Figure 8:
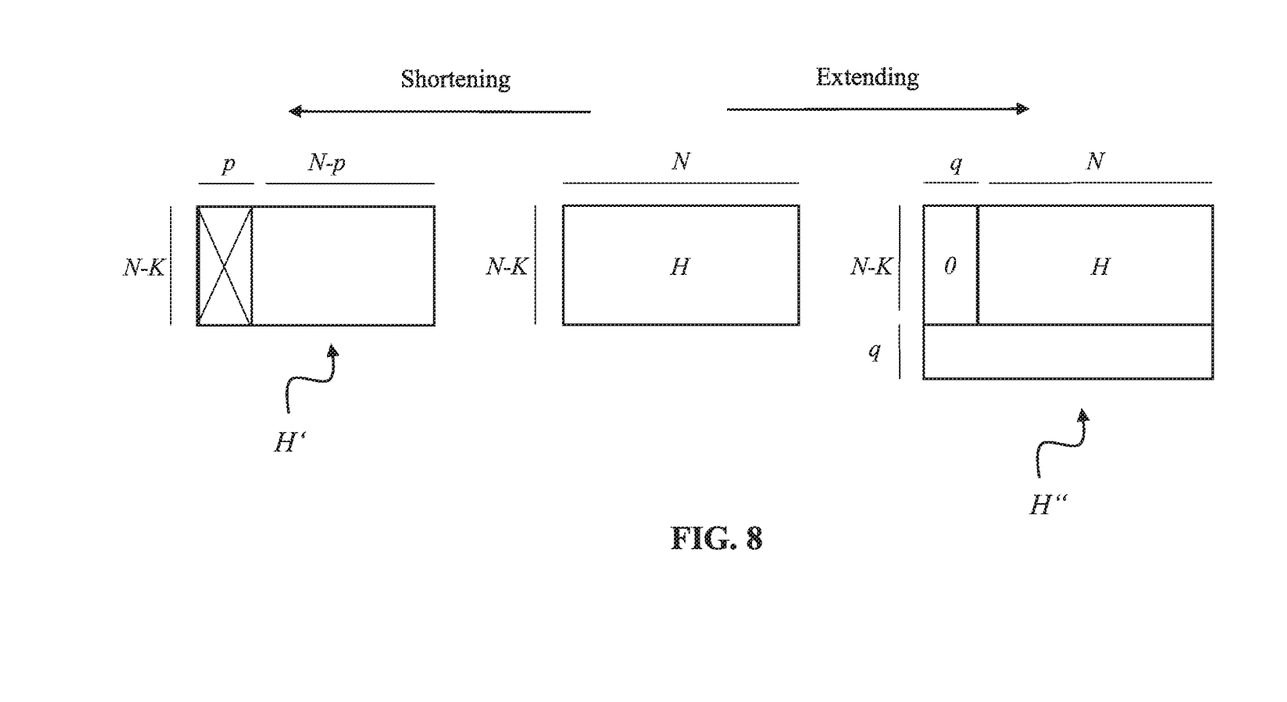
FIG. 8 shows check matrices for an original code (middle), a shortened code (left) and an extended code (right) according to an embodiment of the present disclosure.

Two conventional methods to modify length N or dimension K of a given code are so-called 'shortening' and 'extending'. The effect of these operations on the check matrix of a code is depicted in FIG. 8. Assumed is specifically an $\{N, K\}$ code with check matrix H. Shortening the code by p positions leads to an $\{N-p, K-p\}$ code, i.e. both length N and dimension K are reduced by p. The check matrix H' of the shortened code can be obtained from the check matrix H by removing p columns such that the rank of the matrix does not change. Extending by q positions leads to an $\{N+q, K\}$ code, i.e. the length N increases by q and the dimension K stays the same. The check matrix H'' of the extended code can be obtained from the check matrix H by first adding q zero columns and then adding q rows in a way such that the rank of the matrix increases by q.

For many good algebraic codes, like Hamming codes or Bose-Chaudhuri-Hocquenghem (BCH) codes, efficient decoding algorithms are available, i.e. algorithms that achieve low error rates at low decoding complexity. Such codes, however, are only available for specific values of length N and dimension K. If an application requires other lengths or dimensions, e.g. requires an $\{N', K'\}$ code while so far only $\{N, K\}$ codes are provided, new decoding algorithms need to be developed to match the specific $\{N', K'\}$ code. These algorithms may be less efficient than those for the $\{N, K\}$ codes, even if N' and K' are close to N and K.

Figure 9:
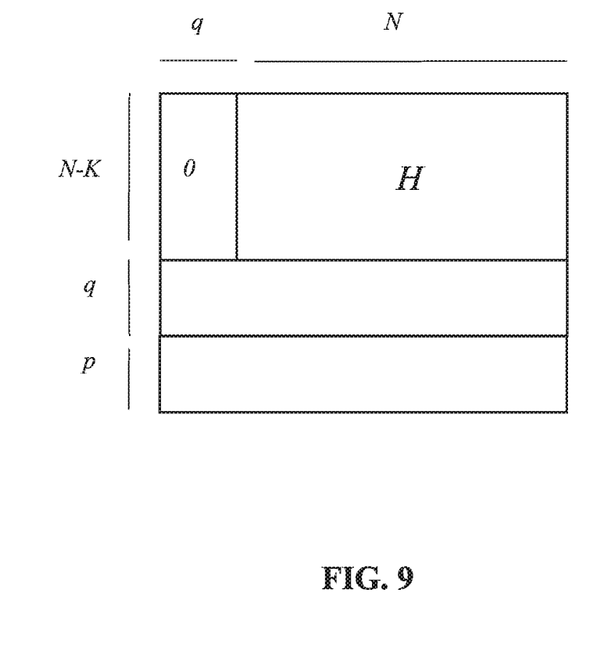
FIG. 9 shows a check matrix for an {N', K'} code modified in a conventional manner from an {N, K} code.

A conventional way of constructing a new code $\{N', K'\}$ from and original $\{N, K\}$ code—with the constraints defined above—is illustrated in FIG. 9 in terms of the check matrices of the codes. The original code is first extended to the desired length N' and then expurgated to the desired dimension K' thus adding further check constraints. The process shown in FIG. 9 in terms of the check matrices is as follows: starting from the check matrix H of the original code, conventionally, first q zero columns are appended to H, and then q+p rows are added to obtain the check matrix H' of the new code.

Since the q+p new check constraints are adjoined in an unstructured way, a decoder of the original {N, K} code cannot be used efficiently to decode the new {N', K'} code.

SUMMARY

In view of the above-mentioned problems and disadvantages, the present invention aims to improve the conventional code modification schemes. In particular, one of the objectives of example embodiments of the present invention is to provide a code generator for generating a modified code from an original code such that the modified code can be efficiently reused by a decoder (or encoder) of the original code. The present invention aims also for an encoding and/or decoding device that operates efficiently based on the modified code. In particular, in example embodiments of the present invention, the original code may be modified by increasing its code length N and at the same time decreasing its code dimension K such that a decoder for the new {N', K'} code can efficiently reuse the decoder of the original {N, K} code.

Figure 10:
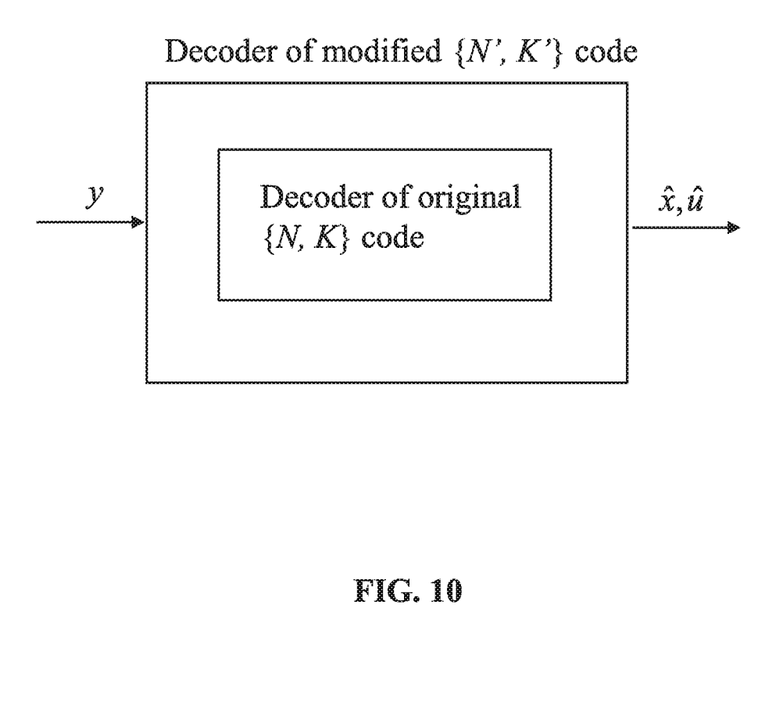
FIG. 10 shows schematically a decoder for a new {N', K'} code reusing a decoder of an original {N, K} code according to an embodiment of the present disclosure.

Such a decoder is illustrated in FIG. 10. The decoder is originally a decoder of the original {N, K} code, i.e. it decodes the observation vector y with the original code to obtain the codeword estimate $\hat{x}$ and the information word estimate $\hat{u}$. However, the decoder can also use the new {N', K'} code for performing this decoding.

In example embodiments of the present invention, an original code is modified in a specific manner, e.g., by a combined shortening and extending operation, to obtain a new code (a modified code). The obtained new code can be efficiently used by an existing decoder of the original code.

A first aspect of the present invention provides a device for encoding and/or decoding data transmitted in a communication channel, the device being configured to encode and/or decode the data based on an {N', K'} code generated from an {N, K} code, wherein N and N' are code lengths, K and K' are code dimensions, N'−N=q>0, and K−K'=p>0, and wherein the {N', K'} code is defined by a check matrix, the check matrix includes {N−K+p+q} rows and {N+q} columns, {N−K} elements in each of {p+q} columns of the check matrix are all zeros, and {N−K} elements in each of the remaining {N−p} columns of the check matrix are the elements of a check matrix defining the {N, K} code.

Advantageously, the device of the first aspect may use the new {N', K'} code for encoding the data, allowing a decoder of the original {N, K} code to efficiently reuse the modified code. Further, the device of the first aspect may efficiently reuse the new {N', K'} code for decoding the data, if it is a decoder of the original code. The device of the first aspect may even perform efficient encoding and/or efficient decoding on the data based on both the new {N', K'} code and the original {N, K} code.

In the present disclosure, N, N', K, K', p, and q are natural numbers greater than zero.

In a possible implementation of the first aspect, the upper {N−K} elements of the left {p+q} columns of the check matrix are all zeros, and the upper {N−K} elements of the remaining {N−p} columns of the check matrix are the elements of the check matrix defining the {N, K} code.

This check matrix is an example that yields particularly good results in terms of minimum distance and reduced multiplicity of the new code. Row and/or column permutations may be applied to the check matrix of the new (modified) code, and the resulting check matrix would lead to the same results.

In a further implementation of the first aspect, the lower {p+q} elements of the left {p+q} columns of the check matrix build an identity matrix.

This allows for a particular simple implementation of the check matrix, and reduced computational complexity.

In a further implementation of the first aspect, each of the lower {p+q} rows is filled with alternating ones and zeros.

Preferably, any two adjacent rows of these lower {p+q} rows start with a one (first row) and a zero (second row), respectively. Thus, the adjacent rows are able to check odd and even indices of the code, respectively.

In a further implementation of the first aspect, the {N, K} and the {N', K'} code are Hamming codes or Bose-Chaudhuri-Hocquenghem codes.

These codes are particularly good algebraic codes, and moreover perform well with the code construction scheme of the present disclosure.

In a further implementation of the first aspect, the {N, K} code is a Hamming code with N=127 and K=120, and the {N', K'} code is a code with N'=128 and K'=119.

For this specific example, the minimum distance of the new code is the same as that of a new code constructed in a conventional manner, but its multiplicity is largely reduced. This significantly decreases error rates under both ML decoding and sub-optimal decoding methods.

In a further implementation of the first aspect, the device includes a code generator according to a second aspect of the present invention or any of its implementations.

The device may particularly be an encoder (in a transmitter or transceiver) and/or a decoder (in a receiver or transceiver) of data, specifically in a mobile communication system or an optical (fibre) communication system. The device is thus advantageously able to modify an original {N, K} code into a new {N', K'} code, which can be efficiently reused. This allows for new applications that operate on other codes.

The second aspect of the present invention provides a code generator for generating an {N', K'} code for encoding and/or decoding data transmitted in a communication channel from an {N, K} code, wherein N and N' are code lengths, K and K' are code dimensions, and the code generator is configured to shorten the {N, K} code to obtain an intermediate code, and extend the intermediate code to obtain the {N', K'} code.

By applying a combined shortening and extending operation on the original {N, K} code the code generator of the first aspect is able to generate the new {N', K'} code such that it can be efficiently reused by a decoder (and/or encoder) of the original code.

In an implementation of the second aspect, N'−N=q>0, K−K'=p>0, and the code generator is configured to shorten the {N, K} code by p positions to obtain an intermediate {N−p, K'} code, and extend the intermediate {N−p, K'} code by p+q positions to obtain the {N', K'} code.

This new code yields particularly good results in terms of the minimum distance and reduced multiplicity.

In a further implementation of the second aspect, the code generator is configured to, for generating the {N', K'} code from the {N, K} code, modify a first check matrix that defines the {N, K} code to obtain a second check matrix that defines the {N', K'} code, the modification of the first check matrix including removing p columns of the first check matrix to obtain a first intermediate matrix, adding {p+q} left or right columns filled with all zeros to the first intermediate matrix to obtain a second intermediate matrix, and adding {p+q} rows to the second intermediate matrix to obtain the second check matrix.

The code generator can thus obtain an efficient new code by operating on the check matrix of the original code in a relatively simple manner. As an example, the p left columns of the first check matrix may be removed to obtain the first intermediate matrix. However, any p columns may be removed as long as the rank constraint is fulfilled. Further, {p+q} bottom rows may be added to the second intermediate matrix to obtain the second check matrix. However, the additional rows may be added above, below, or in between the other rows.

In a further implementation of the second aspect, the code generator is configured to set {p+q} elements of the left or right {p+q} columns of the second check matrix such that they build an identity matrix.

This allows for a particular simple implementation of the check matrix, and for reduced computational complexity. For example, the {p+q} elements may be the lower {p+q} elements of the left or right {p+q} columns of the second check matrix.

In a further implementation of the second aspect, the code generator is configured to set the elements of each of the {p+q} rows of the second check matrix such that it includes alternating ones and zeros.

Preferably, any two adjacent rows of these lower {p+q} rows start with a one (first row) and a zero (second row), respectively. Thus, the adjacent rows are able to check odd and even indices of the code, respectively.

In a further implementation of the second aspect, the {N, K} code and the {N', K'} code are Hamming codes or Bose-Chaudhuri-Hocquenghem codes.

These codes are particularly good algebraic codes, and moreover perform well with the code construction scheme in example embodiments of the present invention.

In a further implementation of the second aspect, the {N, K} code is a Hamming code with N=127 and K=120, and the {N', K'} code is a code with N'=128 and K'=119.

For this specific example, the minimum distance of the new code is the same as that of a new code constructed in a conventional manner, but its multiplicity is largely reduced. This significantly decreases error rates under both ML decoding and sub-optimal decoding methods.

In a further implementation of the second aspect, the code generator is included in a device for encoding and/or decoding data based on the {N', K' } code.

The device may be an encoder and/or decode, for instance, included in a transmitter, receiver, or transceiver for mobile communications.

A third aspect of the present invention provides a method for constructing an {N', K' } code for encoding and/or decoding data transmitted in a communication channel from an {N, K} code, wherein N and N' are code lengths, K and K' are code dimensions, and the method comprises shortening the {N, K} code to obtain an intermediate code, and extending the intermediate code to obtain the {N', K'} code.

In an implementation of the third aspect, N'−N=q>0, K−K'=p>0, and the method comprises shortening the {N, K} code by p positions to obtain an intermediate {N−p, K'} code, and extending the intermediate {N−p, K'} code by p+q positions to obtain the {N', K'} code.

In a further implementation of the third aspect, the method comprises, for generating the {N', K'} code from the {N, K} code, modifying a first check matrix that defines the {N, K} code to obtain a second check matrix that defines the {N', K'} code, the modification of the first check matrix including removing p columns of the first check matrix to obtain a first intermediate matrix, adding {p+q} left or right columns filled with all zeros to the first intermediate matrix to obtain a second intermediate matrix, and adding {p+q} rows to the second intermediate matrix to obtain the second check matrix.

In a further implementation of the third aspect, the method comprises setting {p+q} elements of the left or right {p+q} columns of the second check matrix such that they build an identity matrix.

In a further implementation of the third aspect, the method comprises setting the elements of each of the {p+q} rows of the second check matrix such that it includes alternating ones and zeros.

In a further implementation of the third aspect, the {N, K} code and the {N', K'} code are Hamming codes or Bose-Chaudhuri-Hocquenghem codes.

In a further implementation of the third aspect, the {N, K} code is a Hamming code with N=127 and K=120, and the {N', K'} code is a code with N'=128 and K'=119.

In a further implementation of the third aspect, the method is carried out by a device for encoding and/or decoding data based on the {N', K'} code.

The method of the third aspect and its implementations provide the same advantages and effects as described above for the code generator of the second aspect and its respective implementations.

It has to be noted that all devices, elements, units and means described in the present application could be implemented in the software or hardware elements or any kind of combination thereof. All steps which are performed by the various entities described in the present application as well as the functionalities described to be performed by the various entities are intended to mean that the respective entity is adapted to or configured to perform the respective steps and functionalities. Even if, in the following description of specific embodiments, a specific functionality or step to be performed by external entities is not reflected in the description of a specific detailed element of that entity which performs that specific step or functionality, it should be clear for a skilled person that these methods and functionalities can be implemented in respective software or hardware elements, or any kind of combination thereof.

BRIEF DESCRIPTION OF DRAWINGS

The above described aspects and implementations of the present invention will be explained in the following description of specific embodiments in relation to the enclosed drawings, in which.

DETAILED DESCRIPTION OF EMBODIMENTS

Figure 1:
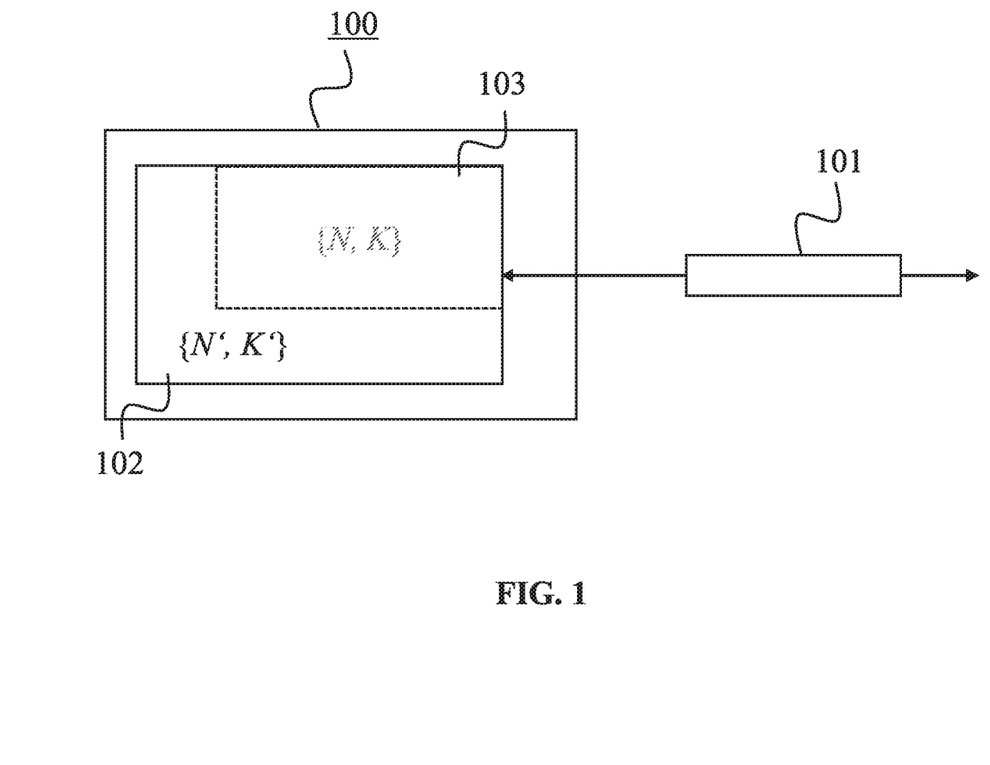
FIG. 1 shows a device for encoding and/or decoding data transmitted in a communication channel according to an embodiment of the invention.

FIG. 1 shows a device 100 for encoding and/or decoding data according to an embodiment of the present invention. That is, FIG. 1 shows an encoder and/or decoder, which may be employed in a transmitter, receiver or transceiver, respectively. The data may be communications data and is transmitted in a (wireless or wired) communication channel 101, e.g., an optical fibre. The device 100 may encode the data, and then send the encoded data over the communication channel 101 to another device for decoding the data. The device 100 may also receive the data over the communication channel 101 from another device that encoded the data, and may then decode the received data.

In particular, the device 100 of FIG. 1 is configured to encode and/or decode the data based on a new {N', K'} code 102 generated from an original {N, K} code 103, wherein N and N' are code lengths, K and K' are code dimensions, N'-N=q>0, and K-K'=p>0. That is, the code length was increased, while the code dimension was decreased. Notably, the device 100 may also be configured to encode and/or decode data based also on the {N, K} code 103.

Figure 2:
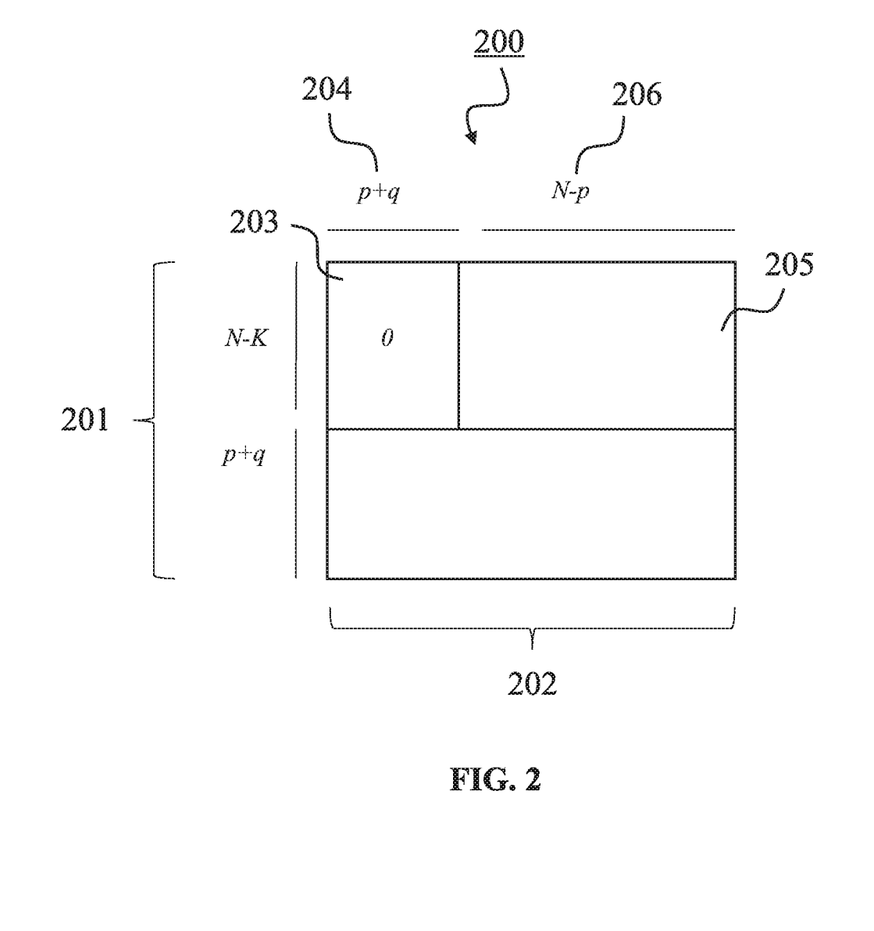
FIG. 2 shows a check matrix for a modified {N', K'} code according to an embodiment of the present invention.

The {N', K'} code 102 is defined by a specific check matrix 200 (FIG. 2 shows an example explained further below in detail). The specific check matrix 200 generally includes {N+p+q} rows 201 and {N+q} columns 202. Thereby, {N-K} elements 203 in each of {p+q} columns 204 of the check matrix 200 are all zeros, and {N-K} elements 205 in each of the remaining {N-p} columns 206 of the check matrix 200 are the elements of a check matrix defining the {N, K} code 103.

FIG. 2 illustrates an exemplary structure of such a specific check matrix 200, which may define the {N', K'} code 102 employed by the device 100 of FIG. 1. The exemplary check matrix 200 of FIG. 2 includes {N-K+p+q} rows 201 and {N+q} columns 202. Here particularly the upper {N-K} elements 203 in each of the left {p+q} columns 204 of the check matrix 200 are all zeros. Further, particularly the upper {N-K} elements 204 in each of the remaining {N-p} columns 206 (i.e. right columns) of the exemplary check matrix 200 are the elements of the check matrix defining the {N, K} code 103.

For encoding of the obtained new code 102, an explicit generator matrix may be obtained or other methods may be applied. Notably, equivalent codes 102 may be obtained by changing the order of the columns 202 of the check matrix 200 shown in FIG. 2, without any impact on the performance parameters of a decoder of the original code 103 using the new code 102. The same holds for changing the order of the rows 201 of the check matrix 200 or a combination of columns 202 and rows 201. The structure of the check matrix 200 as shown in FIG. 2 may further be obtained in several ways, as detailed in below example embodiments.

Figure 3:
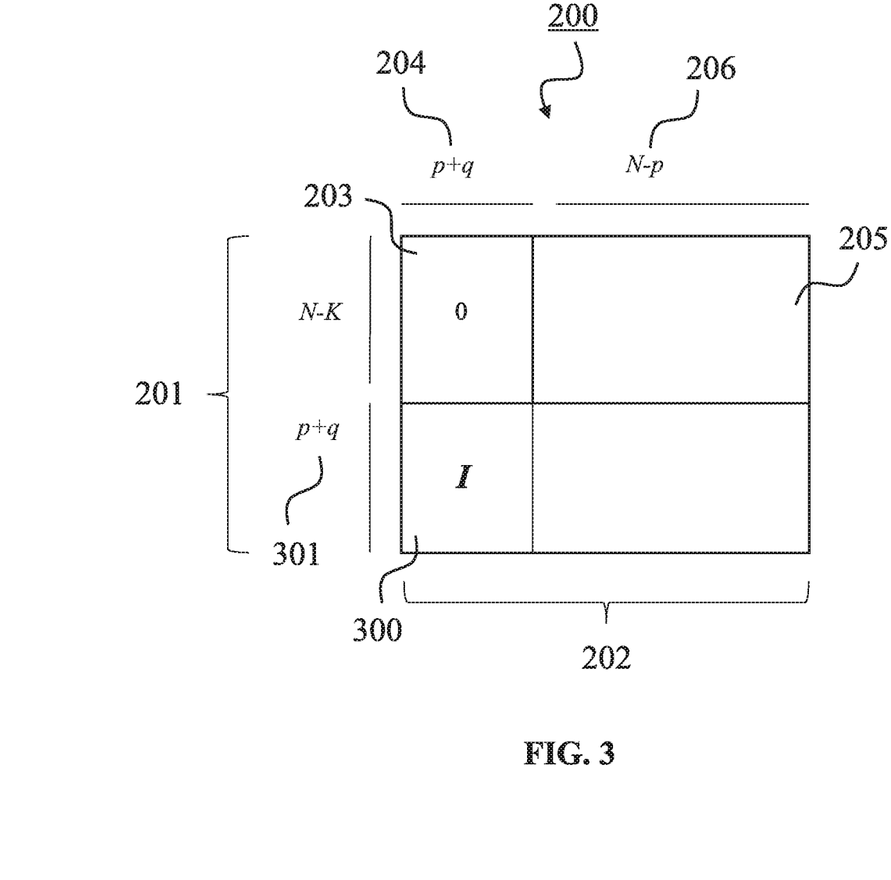
FIG. 3 shows a check matrix for a modified {N', K'} code according to an embodiment of the present invention.

FIG. 3 shows another exemplary structure of a check matrix 200, which builds on the check matrix 200 shown in FIG. 2. In this check matrix 200 of FIG. 3, preferably the lower {p+q} elements 300 of the left {p+q} columns 204 of the check matrix 200 build an identity matrix I. Further, preferably, each of the lower {p+q} rows 301 is filled with alternating ones and zeros. Thereby, the lower rows 301 start preferably with ones and zeros, respectively, in an alternating manner, in order to check odd and even indices of the new code 102, respectively.

Figure 4:
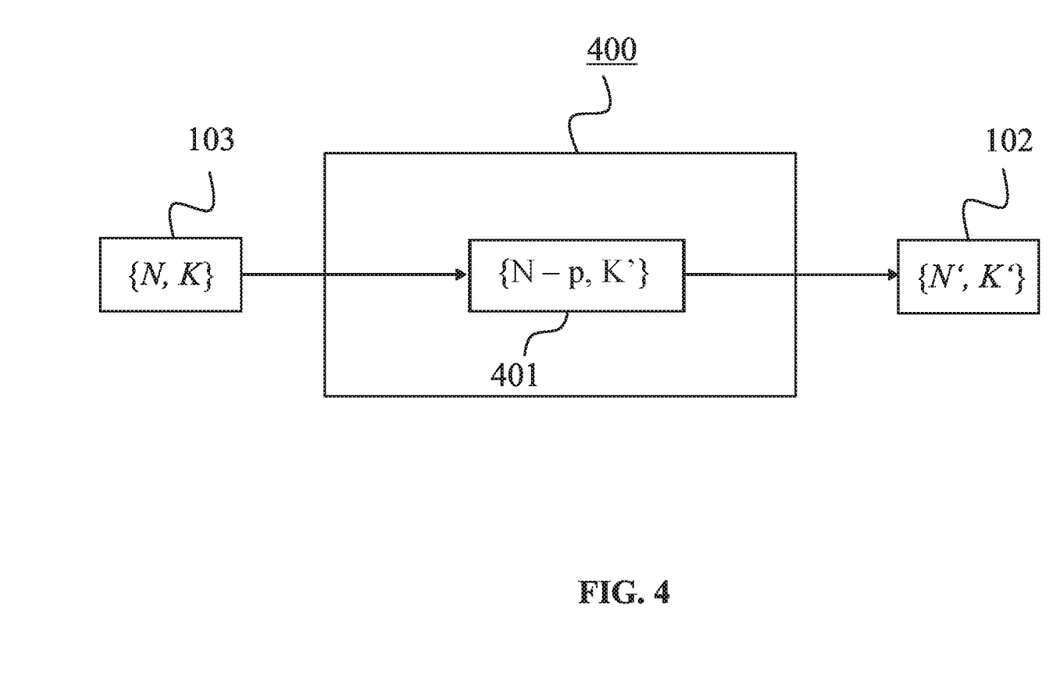
FIG. 4 shows a code generator for generating a modified {N', K'} code from an original {N, K} code according to an embodiment of the present invention.

FIG. 4 shows a code generator 400 according to an embodiment of the present invention. The code generator 400 may be included in the device 100 for encoding and/or decoding data based on the {N', K'} code 102 as shown in FIG. 1. That is, the code generator 400 may generate the code 102 from the {N, K} code 103 for direct use in the device 100. The device 100 may thereby be configured to encode and/or decode the data based on the new {N', K'} code 102 or the original {N, K} code 103. Thereby, again N and N' are code lengths, and K and K' are code dimensions.

The code generator 400 is particularly configured to shorten the original {N, K} code 103 to obtain an intermediate code 401, and then extend the intermediate code 401 to obtain the new {N', K'} code 102. For instance, the code generator 400 may be configured to shorten the {N, K} code 103 by p positions to obtain the intermediate {N-p, K'} code 401, and to extend the intermediate {N-p, K'} code 401 by p+q positions to obtain the {N', K'} new code 102, wherein N'-N=q>0, K-K'=p>0, i.e. the code dimension is decreased while the code length is increased to obtain the new code 102.

Figure 5:
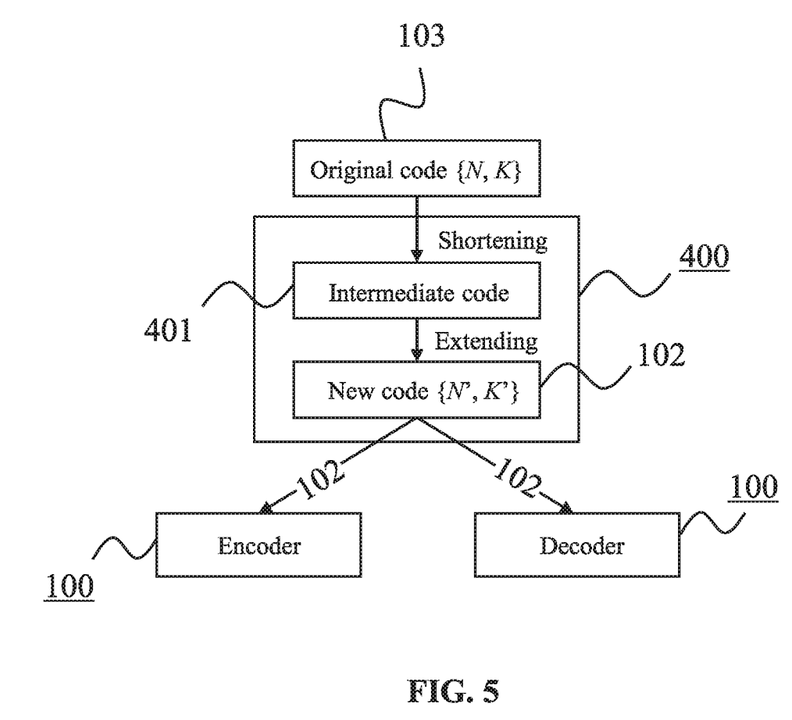
FIG. 5 shows a construction of a modified {N', K'} code from an original {N, K} code an used in a device for encoding (encoder) or device for decoding (decoder) according to an embodiment of the present invention.

FIG. 5 illustrates the generation of the new {N', K'} code 102 from the original {N, K} code 103 as performed by the code generator 400 of FIG. 4 in more detail. Assumed is here a given {N, K} code 103 with a check matrix H of size (N-K)×N. Further assumed is here a desired {N', K'} code 102 of a larger length N' and a smaller dimension K' and with a check matrix H' of size (N'-K')×N'. The task of the code generator 400 is to construct H' from H, in order to allow efficient reuse of the new code 102 by a decoder of the original code 103.

The code construction, as preferably carried out by the code generator 400, includes the following two steps to obtain the new {N', K'} code 102. After these steps the new {N', K'} code 102 may be provided to and/or used in an encoder and/or a decoder (e.g. in a device 100 as shown in FIG. 1):

Step 1: Shorten the {N, K} code 103 by p=K-K' positions to obtain an {N-p, K-p} code 401 (the intermediate code), i.e. to obtain an {N-p, K'} code with the desired code dimension K'=K-p.

Step 2: Extend the obtained {N-p, K'} intermediate code 401 by p+q positions to obtain a new {N-p+(p+q), K'} code 102—i.e. an {N+q, K'} code—with the desired code length N'=N+q.

For decoding, the structure and relation to the original {N, K} code 103 can efficiently be exploited. The intermediate code 401 is a shortened code of the original {N, K} code 103. Decoding methods of the original code 103, e.g. Chase decoding or syndrome-based decoding, can easily deal with the shortening. The modified code 102 is an extended code of the intermediate code 401. Decoding is typically based on metric calculations, like the ML metric mentioned above, and the metric of an extended codeword can easily be computed from the metric of an intermediate codeword. Thus, an existing decoding algorithm for the original code 103 can efficiently be exploited for decoding of the new modified code 102.

Figure 6:
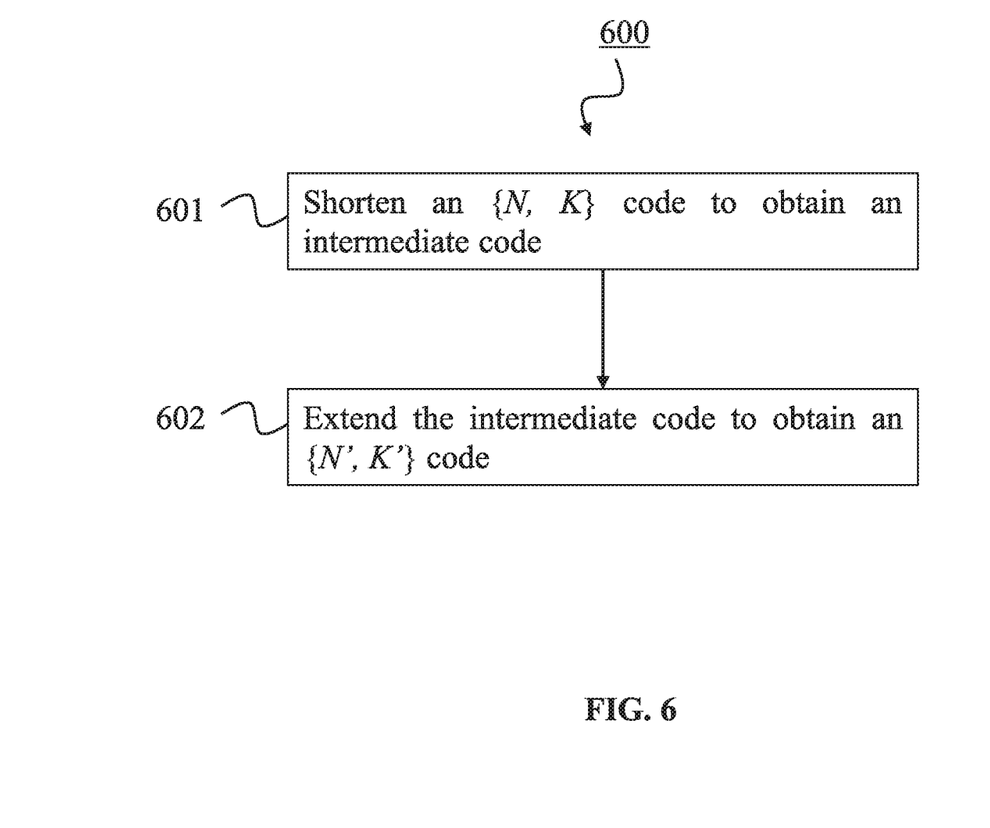
FIG. 6 shows a method according to an embodiment of the present invention.

FIG. 6 shows a method 600 according to an embodiment of the present invention. The method 600 is for constructing an {N', K'} code 102 for encoding and/or decoding data transmitted in a communication channel 101 from an {N, K} code 103. The method 600 may be carried out by a device, like the code generator 400 shown in FIG. 3 or the device 100 shown in FIG. 1.

The code construction method 600 of the present invention is now explained in more detail based on an example. In particular, the aim is to specifically construct a {128, 119} code 102 from a {127, 120} Hamming code 103. This means that the code length N is to be increased by q=1 and the code dimension K is to be decreased by p=1. Notably, for Hamming codes, efficient syndrome decoding algorithms are available.

The check matrix H of the original Hamming code 103 consists of all binary non-zero column vectors of length 7. The check matrix of the cyclic Hamming code 103 can be constructed in the following way. Let a denote a root of the primitive polynomial $g(a)=a^7+a^3+1$, and let (i) denote the binary representation of $\alpha^i$ in the form of a column vector. The check matrix can then be defined as $$H=[(0)(1) \ldots (126)]$$

Following the above-described general code construction, the original Hamming code 103 is first shortened by p=1 positions, and for example the first position is chosen. The check matrix of the resulting intermediate code 401 is $$H_i=[(1) \ldots (126)]$$

Then, this intermediate code 401 is extended by p+q=2 positions, for instance by appending two all-zero columns (at the left of the matrix) and by further adding two check row vectors (i.e. effectively two additional check constraints for the new code 102) at the bottom, so that the check matrix 200 of the new code 102 becomes $$H' = \begin{bmatrix} 0 & 0 & (1) & \ldots & (126) \\ 1 & 0 & & h_1 & \\ 0 & 1 & & h_2 & \end{bmatrix}$$

Without loss of generality, the lower left part of this check matrix 200 may always be chosen to be the identity matrix (compare also to the check matrix 200 in FIG. 3). Because of the two all-zero columns, computational complexity may be reduced. Further, the row vectors $h_1$ and $h_2$ are preferably chosen to be vectors with zeros and ones alternating (compare again to the check matrix 200 in FIG. 3), wherein $h_1$ preferably starts with 1 and $h_2$ preferably starts with 0. In this way, the penultimate row may advantageously be designed to check the odd indices, and the last row to check the even indices of the new code 102.

The proposed code construction according to the present invention is advantageous for the decoding of the new {N', K'} code 102 (e.g., the {128, 119} code). Namely, the decoding algorithm for the original {N, K} code 103 (e.g., the {127, 120} code) can efficiently be reused, as already detailed above.

The code construction according to the present invention further provides a better distance profile. As an example, the minimum distance and its multiplicity was numerically evaluated for the example with the {128, 119} code 102 and an alternative code construction, obtained according to the check matrix shown in FIG. 9. The minimum distance is the same, namely 4, in both constructions. However, the multiplicity is largely reduced with the code construction according to the present invention. This is also observed clearly in error rate simulations under both ML decoding and sub-optimal decoding methods.

The present invention has been described in conjunction with various embodiments as examples as well as implementations. However, other variations can be understood and effected by people skilled in the art and practicing the claimed invention, from studying the drawings, this disclosure and the independent claims. In the claims as well as in the description the word "comprising" does not exclude other elements or steps and the indefinite article "a" or "an" does not exclude a plurality. A single element or other unit may fulfill the functions of several entities or items recited in the claims. The mere fact that certain measures are recited in the mutual different dependent claims does not indicate that a combination of these measures cannot be used in an advantageous implementation.

The invention claimed is:

1. A device for encoding and/or decoding data transmitted in a communication channel, comprising:
   at least one processor; and
   a memory configured to store computer readable instructions that, when executed by the at least one processor, cause the device to perform operations comprising:
   encoding and/or decoding the data transmitted in the communication channel based on an {N', K'} code generated from an {N, K} code, wherein N and N' are code lengths, K and K' are code dimensions, N'−N=q>0, and K−K'=p>0, N, N', K, K', p and q being natural numbers greater than zero, and wherein
   the {N, K} code is defined by a first check matrix, and the {N', K'} code is defined by a second check matrix,
   the second check matrix includes {N−K+p+q} rows and {N+q} columns,
   {N−K} elements in each of {p+q} columns of the second check matrix are all zeros, and
   {N−K} elements in each of right-most {N−p} columns of the second check matrix are elements of the first check matrix defining the {N, K} code.

2. The device according to claim 1, wherein
   upper-most {N−K} elements in each of left-most {p+q} columns of the second check matrix are all zeros, and
   upper-most {N−K} elements in each of the right-most {N−p} columns of the second check matrix are the elements of the first check matrix defining the {N, K} code.

3. The device according to claim 2, wherein
   lower-most {p+q} elements of the left-most {p+q} columns of the second check matrix is an identity matrix.

4. The device according to claim 2, wherein
   each of lower-most {p+q} rows comprises alternating ones and zeros.

5. The device according to claim 1, wherein
   the {N, K} code and the {N', K'} code are Hamming codes or Bose-Chaudhuri-Hocquenghem codes.

6. The device according to claim 1, wherein
   the {N, K} code is a Hamming code with N=127 and K=120, and
   the {N', K'} code is a code with N'=128 and K'=119.

7. A code generator for generating an {N', k'} code for encoding and/or decoding data transmitted in a communication channel from an {N, K} code, wherein N and N' are code lengths, K and K' are code dimensions, and the code generator is configured to:
   shorten the {N, K} code to obtain an intermediate code, and
   extend the intermediate code to obtain the {N', K'} code, wherein the {N, K} code is defined by a first check matrix, and the {N', K'} code is defined by a second check matrix, the second check matrix includes {N−K+p+q} rows and {N+q} columns, {N−K} elements in each of right-most {N−p} columns of the second check matrix axe elements of the first check matrix defining the {N, K} code, and N, N', K, K', p and q are natural numbers greater than zero.

8. The code generator according to claim 7, wherein N'−N=q>0, K−K'=p>0, the {N, K} code is shortened by p positions to obtain the intermediate {N−p, K'} code, and the intermediate {N−p, K'} code is extended by p+q positions to obtain the {N', K'} code.

9. The code generator according to claim 8, being further configured to, for generating the {N', K'} code from the {N, K} code, modify the first check matrix that defines the {N, K} code to obtain the second check matrix that defines the {N', K'} code, the modification of the first check matrix including:

removing p columns of the first check matrix to obtain a first intermediate matrix, adding {p+q} left-most or right-most columns filled with all zeros to the first intermediate matrix to obtain a second intermediate matrix, and adding {p+q} rows to the second intermediate matrix to obtain the second check matrix.

10. The code generator according to claim 9, being further configured to:

set {p+q} elements in each of left-most or right-most {p+q} columns of the second check matrix to obtain an identity matrix.

11. The code generator according to claim 9, being further configured to:

set elements of each of {p+q} rows of the second check matrix to include alternating ones and zeros.

12. The code generator according to claim 7, wherein the {N, K} code and the {N', K'} code are Hamming codes or Bose-Chaudhuri-Hocquenghem codes.

13. The code generator according to claim 7, wherein the {N, K} code is a Hamming code with N=127 and K=120, and the {N', K'} code is a code with N'=128 and K'=119.

14. A device for encoding and/or decoding data including the code generator according to claim 7, wherein the encoding and/or decoding data is based on the {N', K'} code.

15. A method for constructing an {N', K'} code for encoding and/or decoding data transmitted in a communication channel from an {N, K} code, wherein N and N' are code lengths, K and K' are code dimensions, and the method comprises:

shortening the {N, K} code to obtain an intermediate code, and extending the intermediate code to obtain the {N', K'} code, wherein the {N, K} code is defined by a first check matrix, and the {N', K'} code is defined by a second check matrix, the second check matrix includes {N−K+p+q} rows and {N+q} columns, {N−K} elements in each of right-most {N−p} columns of the second check matrix are elements of the first check matrix defining the {N, K} code, and N, N', K, K', p and q are natural numbers greater than zero.

16. The method according to claim 15, wherein N'−N=q>0,K−K'=p>0, and the shortening the {N, K} code to obtain an intermediate code comprises shortening the {N, K} code by p positions to obtain an intermediate {N−p, K'} code, and the extending the intermediate code to obtain the {N', K'} code comprises extending the intermediate {N−p, K'} code by p+q positions to obtain the {N', K'} code.

17. The method according to claim 16, further comprising, for constructing the {N', K'} code from the {N, K} code, modifying the first check matrix defining the {N, K} code to obtain the second check matrix defining the {N', K'} code, the modification of the first check matrix including:

removing p columns of the first check matrix to obtain a first intermediate matrix, adding {p+q} left-most or right-most columns filled with all zeros to the first intermediate matrix to obtain a second intermediate matrix, and adding {p+q} rows to the second intermediate matrix to obtain the second check matrix.

18. The method according to claim 17, further comprising:

setting {p+q} elements in each of left-most or right-most {p+q} columns of the second check matrix to obtain an identity matrix.

19. The method according to claim 17, further comprising:

setting elements of each of {p+q} rows of the second check matrix to include alternating ones and zeros.

20. The method according to claim 15, wherein the {N, K} code and the {N', K'} code are Hamming codes or Bose-Chaudhuri-Hocquenghem codes.

* * * * *

UNITED STATES PATENT AND TRADEMARK OFFICE
CERTIFICATE OF CORRECTION

| | | |
|---|---|---|
| PATENT NO. | : 11,316,614 B2 | |
| APPLICATION NO. | : 16/934180 | |
| DATED | : April 26, 2022 | |
| INVENTOR(S) | : Huijian Zhang et al. | |

It is certified that error appears in the above-identified patent and that said Letters Patent is hereby corrected as shown below:

In the Claims

Claim 7, at Column 11, Line 4, replace "axe" with "are".

Signed and Sealed this
Twenty-fourth Day of May, 2022

*Katherine Kelly Vidal*

Katherine Kelly Vidal
*Director of the United States Patent and Trademark Office*